(12) United States Patent
Rajgopal et al.

(10) Patent No.: US 12,130,755 B2
(45) Date of Patent: Oct. 29, 2024

(54) SERIAL INTERFACE FOR AN ACTIVE INPUT/OUTPUT EXPANDER OF A MEMORY SUB-SYSTEM

(71) Applicant: Micron Technology, Inc., Boise, ID (US)

(72) Inventors: Suresh Rajgopal, San Diego, CA (US); Chulbum Kim, San Jose, CA (US); Dustin J. Carter, Placerville, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/468,264

(22) Filed: Sep. 7, 2021

(65) Prior Publication Data
US 2023/0075279 A1  Mar. 9, 2023

(51) Int. Cl.
| G06F 13/16 | (2006.01) |
| G06F 12/10 | (2016.01) |
| G06F 13/42 | (2006.01) |
| G11C 16/04 | (2006.01) |
| H03M 9/00  | (2006.01) |

(52) U.S. Cl.
CPC ......... *G06F 13/1668* (2013.01); *G06F 12/10* (2013.01); *G06F 13/4234* (2013.01); *G06F 13/4282* (2013.01); *G11C 16/0483* (2013.01); *H03M 9/00* (2013.01)

(58) Field of Classification Search
None
See application file for complete search history.

(56) References Cited

U.S. PATENT DOCUMENTS

| 5,754,436 A * | 5/1998 | Walsh ................. G06F 9/30083 700/286 |
| 5,771,373 A * | 6/1998 | Kau ...................... G06F 1/3203 713/500 |
| 5,835,733 A * | 11/1998 | Walsh ...................... G06F 13/28 361/679.41 |
| 5,848,253 A * | 12/1998 | Walsh ..................... G06F 13/28 710/308 |
| 5,870,621 A * | 2/1999 | Walsh ................... G06F 1/3203 712/E9.032 |

(Continued)

FOREIGN PATENT DOCUMENTS

| EP | 0831390 A1 | 3/1998 |
| WO | 2021-087226 A1 | 5/2021 |

OTHER PUBLICATIONS

International Search Report and Written Opinion for the International Application No. PCT/US2022/042546, mailed on Dec. 23, 2022, 10 pages.

*Primary Examiner* — Henry Tsai
*Assistant Examiner* — Christopher A Bartels
(74) *Attorney, Agent, or Firm* — Lowenstein Sandler LLP (57) ABSTRACT

An input/output (I/O) command referencing a logical address of a memory sub-system is received by an active input/output expander (AIOE). The I/O command is received from a memory sub-system controller via the AIOE. The AIOE identifies a physical block address corresponding to the logical block address. The AIOE identifies, among a plurality of memory devices, a memory device associated with the physical block address. The AIOE converts the I/O command received via the serial interface to a parallel interface compliant I/O command. The AIOE sends the parallel interface compliant I/O command to the memory device.

17 Claims, 6 Drawing Sheets

(56) References Cited

U.S. PATENT DOCUMENTS

| | | | | |
|---|---|---|---|---|
| 5,875,312 A * | 2/1999 | Walsh | G06F 13/28 | 710/308 |
| 8,078,781 B2 * | 12/2011 | Goren | G06F 13/364 | 710/200 |
| 8,601,291 B2 * | 12/2013 | Ewing | H02J 13/0005 | 361/601 |
| 9,762,547 B2 * | 9/2017 | Binder | H04L 63/18 | |
| 10,642,764 B1 * | 5/2020 | Gerhart | G06F 13/4282 | |
| 10,649,949 B1 * | 5/2020 | Suarez | G06F 13/24 | |
| 11,232,048 B2 * | 1/2022 | Hsieh | G06F 13/1668 | |
| 11,256,644 B2 * | 2/2022 | Mekad | G06F 13/4022 | |
| 11,625,345 B2 * | 4/2023 | Hsieh | G06F 13/1668 | 710/5 |
| 2004/0078513 A1 | 4/2004 | Yamazaki | | |
| 2010/0064065 A1 * | 3/2010 | Depta | G06F 13/4022 | 710/36 |
| 2010/0169525 A1 * | 7/2010 | Natanel | G06F 13/362 | 710/110 |
| 2010/0199010 A1 * | 8/2010 | Goren | G06F 13/364 | 710/244 |
| 2011/0060873 A1 | 3/2011 | Tanaka | | |
| 2011/0107002 A1 * | 5/2011 | Jones | G06F 13/4027 | 710/312 |
| 2012/0166582 A1 * | 6/2012 | Binder | G06F 21/602 | 709/217 |
| 2014/0070628 A1 * | 3/2014 | Ewing | G06F 13/4282 | 307/115 |
| 2014/0304534 A1 * | 10/2014 | Ewing | G06F 1/266 | 713/310 |
| 2015/0012757 A1 * | 1/2015 | Binder | G06F 21/85 | 713/190 |
| 2016/0011639 A1 * | 1/2016 | Ewing | G06F 1/26 | 710/110 |
| 2017/0025400 A1 * | 1/2017 | Khalaf | G06F 3/0629 | |
| 2020/0073840 A1 * | 3/2020 | Mekad | G06F 13/4022 | |
| 2022/0179586 A1 * | 6/2022 | Balakrishnan | G06F 3/064 | |
| 2023/0221887 A1 * | 7/2023 | Fujimoto | G06F 3/0679 | 711/154 |

* cited by examiner

```
┌─────────────────────────────────────────────────────────┐
│ Receive, from a memory sub-system controller via a      │
│ controller-side serial interface, an input/output (I/O) │
│ command referencing a logical address of a memory       │
│ sub-system.                                             │
│ 410                                                     │
└─────────────────────────────────────────────────────────┘
                            │
                            ▼
┌─────────────────────────────────────────────────────────┐
│ Identify a physical block address corresponding to the  │
│ logical block address.                                  │
│ 420                                                     │
└─────────────────────────────────────────────────────────┘
                            │
                            ▼
┌─────────────────────────────────────────────────────────┐
│ Identify, among a plurality of memory devices, a memory │
│ device associated with the physical block address.      │
│ 430                                                     │
└─────────────────────────────────────────────────────────┘
                            │
                            ▼
┌─────────────────────────────────────────────────────────┐
│ Convert the I/O command received via the serial         │
│ interface to a parallel interface compliant I/O command.│
│ 440                                                     │
└─────────────────────────────────────────────────────────┘
                            │
                            ▼
┌─────────────────────────────────────────────────────────┐
│ Send the parallel interface compliant I/O command to    │
│ the memory device.                                      │
│ 450                                                     │
└─────────────────────────────────────────────────────────┘
```

SERIAL INTERFACE FOR AN ACTIVE INPUT/OUTPUT EXPANDER OF A MEMORY SUB-SYSTEM

TECHNICAL FIELD

Embodiments of the disclosure relate generally to memory sub-systems, and more specifically, relate to a serial interface for an active input/output expander for a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to a serial interface for an active input/output expander (AIOE) in a memory sub-system controller. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Memory sub-systems can include an input/output expander (IOE) to process commands (such as read, write, read status, get feature, etc.) from a host system. One advantage of an IOE can be to reduce the number of commands that each memory device is exposed to. That is, the IOE can receive the commands from the memory sub-system controller and direct it to the appropriate memory device. Thus, each memory device is exposed to only the commands that are directed to the memory dies within the particular memory device.

The commands that an IOE receives from a host system can correspond to data stored on multiple memory devices, each having multiple memory die. In embodiments, a command received from the host system can include the logical address of the data associated with the command, and the memory sub-system controller can translate the logical address to a physical block address. In embodiments, the IOE can process the command by directing the command to the memory device associated with the physical block address. Conventional IOE can be communicatively coupled to the memory sub-system controller via a parallel interface (e.g., a parallel interface compliant with Open NAND Flash Interface (ONFI) specifications), to send and receive commands in accordance with the ONFI protocol. An IOE can also include an ONFI-compliant interface to communicate with the memory devices (i.e., a memory-side interface).

An IOE can be active or passive. An active IOE (AIOE) has active processing circuitry to clean and improve the quality of the signal traveling to the memory device. AIOEs can be used when the data rates of the interface and the loading of the memory device increase significantly. A passive IOE can act as a switch or multiplexor, thus reducing the memory device loading seen by the controller channel. A passive IOE may not actively improve the quality of the signal.

As host systems continue to increase in speed, the performance of memory sub-systems must also continue to improve to match the host's bandwidth. One way to improve the quality of the signal when operating at high data rates is to use an active IOE. In order to further increase the speed of a memory sub-system that includes a conventional AIOE, additional channels can be added to the parallel interface between the memory sub-system controller and the AIOE, and/or the speed of each channel can be increased. A channel can refer to a communications link connecting the AIOE to the memory sub-system controller on one side and the memory devices on the other side. A channel can be a parallel communication line, in which multiple bits (e.g., 8 bits) are transmitted simultaneously over multiple wires. There is a finite number of channels that can be added to a parallel interface before it becomes cumbersome, inefficient, and cost prohibitive. Additional channels added to a parallel interface result in additional space taken on the printed circuit board (PCB) of the memory sub-system controller. That is, adding channels results in extra wires attached to the PCB, thus taking up more space in the system. The increased number of wires on the PCB can also contribute to parasitic effects, such as parasitic resistance, parasitic capacitances, and crosstalk. Additionally, adding channels can result in increasing the length of the wires (i.e., the trace lengths), which has a negative effect on the energy efficiency of the memory sub-system. Furthermore, increasing the speed at which each channel operates can negatively affect the signal integrity and energy efficiency. Hence, adding channels to a conventional AIOE or increasing the channels' speeds to try to match the host's increasing speed and bandwidth can be inefficient and undesirable.

Aspects of the present disclosure address the above and other deficiencies by having a memory sub-system that includes an AIOE connected to the memory sub-system controller via a serial interface. By using a serial interface between the AIOE and the memory sub-system controller, the bandwidth of the memory sub-system can be increased to match that of the host system while maintaining a smaller footprint on the PCB and supporting longer conductive lines without sacrificing IO speed or energy efficiency.

The serial interface can include lanes to process input/output commands from the host system. A lane can be made up of one or more conductive lines. A lane with a single conductive line can be called a single signal lane, while a lane with two conductive lines can be called a differential signal lane. A differential signal lane is used to transmit data using two complimentary signals over a pair of traces (or conductive lines). Both traces carry the same signal, one of which can be a positive signal and the other can be a negative signal. The receiving circuit can analyze the difference between the positive and negative signals to determine the signal transmitted.

In embodiments, the serial interface includes pairs of differential lanes. Each pair can include a transmit differential signal lane and a receive differential signal lane. Additionally, the memory sub-system controller side interface of the AIOE can include one or more single signal lanes to receive certain commands from the memory sub-system controller. In embodiments, the memory-side of the AIOE, used to connect to the memory devices, can be a parallel ONFI-compliant interface or a serial interface. In embodiments, the interface of memory-side of the AIOE can be determined based on the memory device itself. That is, for memory devices that have a parallel interface, the memory-side of the AIOE can be a parallel interface. The AIOE-side interface of the memory sub-system controller can be a serial interface in order to communicate with the serial interface of the AIOE.

Advantages of the present disclosure include, but are not limited to, increased performance of the AIOE matching that of the host system, increased energy efficiency, and reduced area on the PCB. For example, an 8-channel ONFI-compliant parallel interface connecting the memory sub-system controller to the AIOE would be significantly larger in area than a serial interface AIOE. Thus, by using a serial interface, the AIOE results in area reduction on the PCB by reducing the number of PCB layers, which reduces costs associated with the PCB. Furthermore, using a serial interface takes up less physical space on the memory sub-system controller itself. That is, a serial interface used to achieve a certain performance level while maintaining energy efficiency takes up less space on the PCB than a parallel interface that can achieve the same level of performance.

Additionally, a serial interface can result in increased performance between the AIOE and the memory sub-system controller while maintaining data integrity. A serial interface can drive longer conductive lines (or trace lengths) compared to those for a parallel interface while maintaining energy efficiency. That is, increased conductive lines in a parallel interface can increase when additional channels are added to the parallel interface to try to match the increasing host system's speed. However, increased conductive lines in a parallel interface negatively affect the energy per bit required to transmit I/O across the longer conductive lines. In order to counteract the negative effects of the longer conductive lines, a memory sub-system can downgrade the frequency of the I/O operations, however that would result in lower speeds, thus creating a bottleneck in the memory sub-system. Using a serial interface enables longer conductive lines without sacrificing I/O speed.

Figure 1:
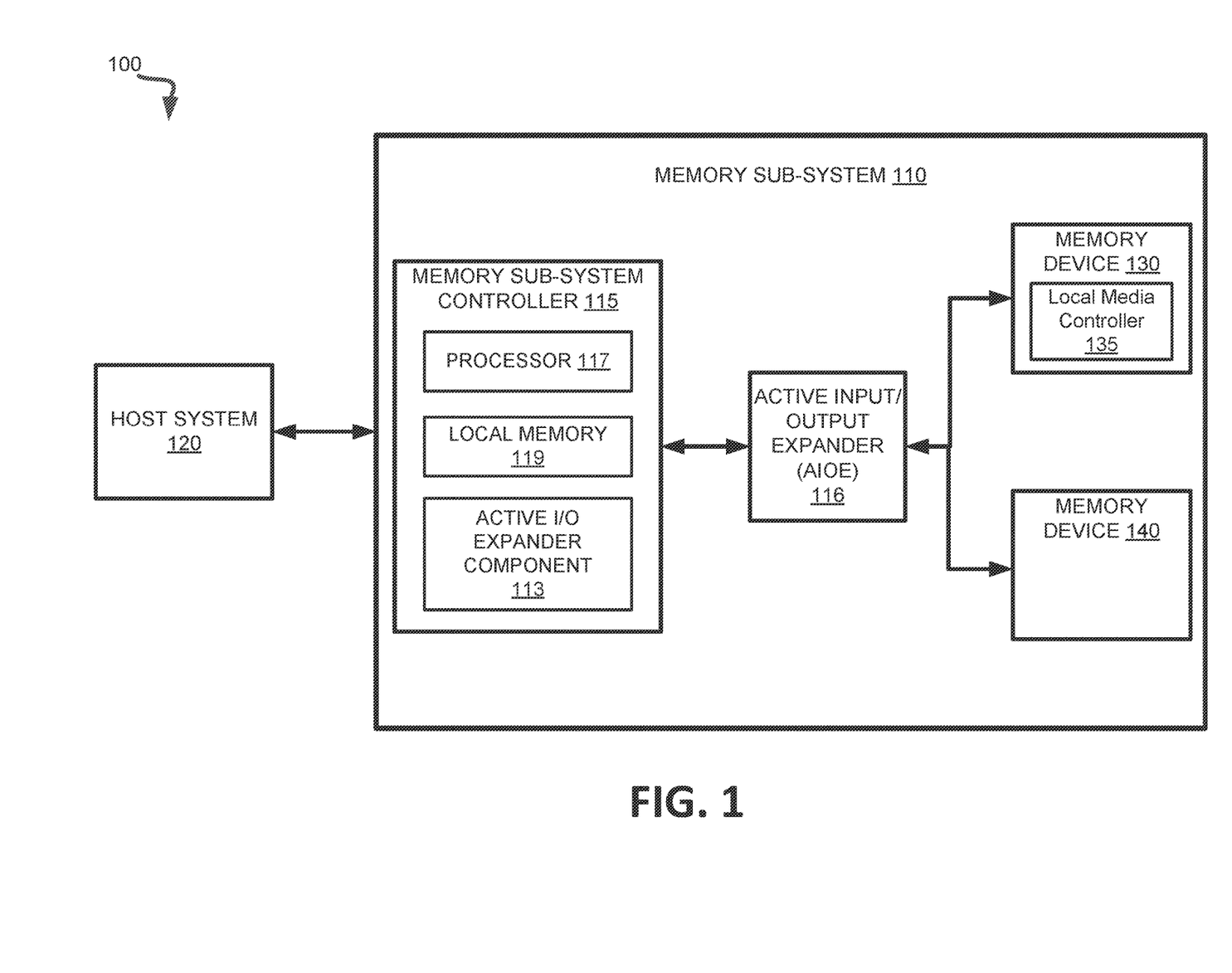
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes an active input/output expander (AIOE) component 113 that can integrate an AIOE with a serial interface within the memory sub-system. In some embodiments, the memory sub-system controller 115 includes at least a portion of the AIOE component 113. In some embodiments, the AIOE component 113 is part of the host system 110, an application, or an operating system. In other embodiments, local media controller 135 includes at least a portion of AIOE component 113 and is configured to perform the functionality described herein.

The AIOE component 113 can employ an active input/output expander (AIOE) 116 that has a serial interface on the controller-side and a parallel interface on the memory-side of the AIOE 116. An AIOE 116 can be used to process commands received from the host system 120 and direct the commands to the appropriate memory device 130, 140. In embodiments, the memory sub-system controller 115 can receive the commands from the host system 120. AIOE component 113 can process the commands. Processing a command can include translating the logical address associated with the command to a physical block address within the memory sub-system 110. Processing a command can also include generating a serial interface compliant signal to send to the AIOE 116 through a serial interface. For example, the memory sub-system controller 115 can load the received command into the flip flops (or latches) of a shift register and generate a serial signal using a shared clock signal. The AIOE component 113 can send the serial interface compliant signal to the AIOE 116. The AIOE 116 can process the signal and identify the intended memory device 130, 140 associated with the command. Processing the signal can involve using the active elements of the AIEO to clean the signal, which can include, for example, reducing the jitter and improving the slew rate of the signal (i.e., the change in voltage per unit of time). The AIOE 116 can generate a parallel interface compliant (e.g., an ONFI-compliant) signal to send the command to the appropriate memory device 130, 140 through a parallel interface. In embodiments, the AIOE component 113 can receive an indication from the AIOE 116 that the signal has been successfully received, and/or that the I/O command has been successfully performed. The AIOE 116 can forward such notifications to the AIOE component 113. Further details with regards to the operations of the AIOE component 113 and AIOE 116 are described below.

Figure 2:
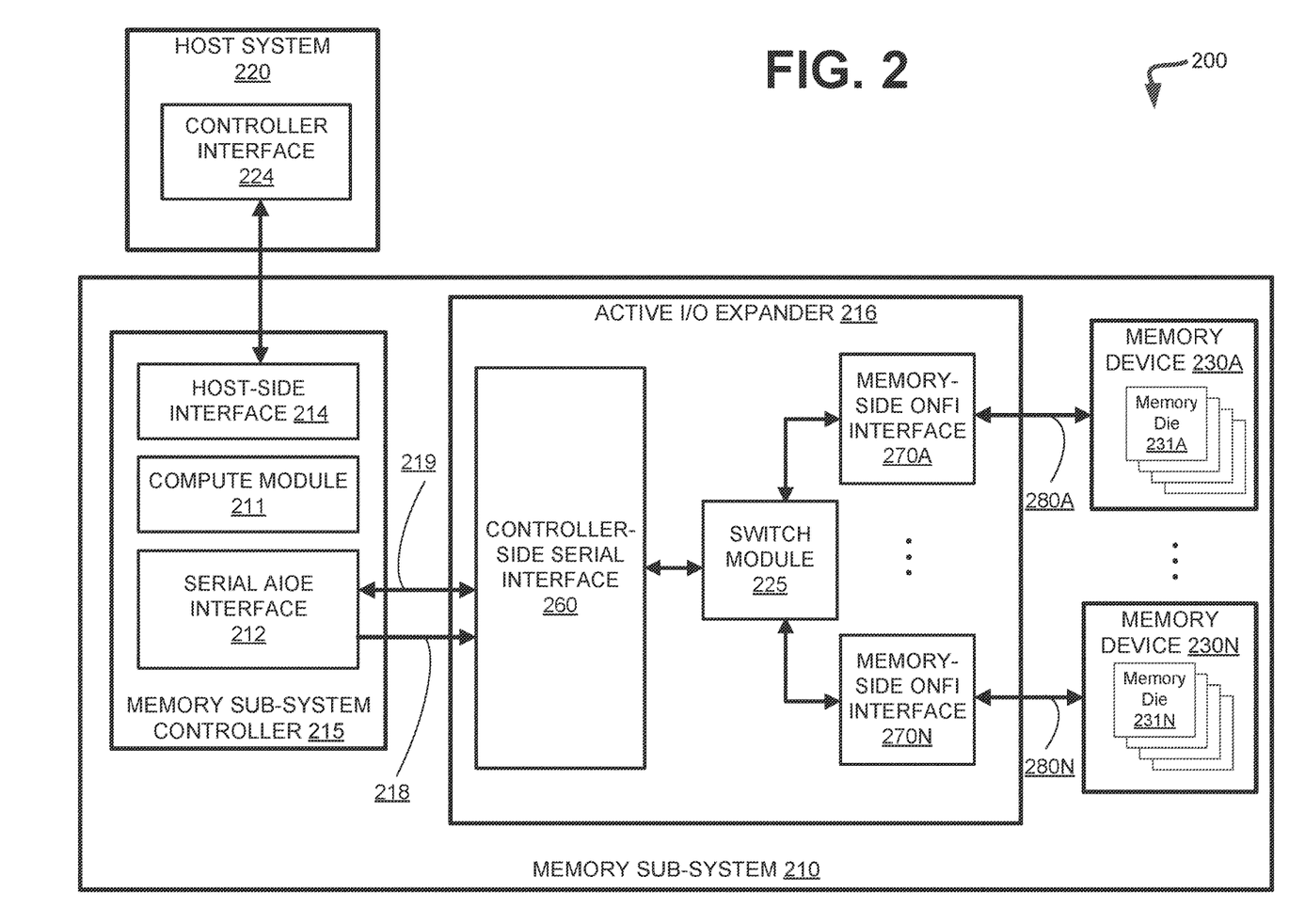
FIG. 2 illustrates an example computing system that includes an active input/output expander associated with a memory sub-system in accordance with some embodiments of the present disclosure.

FIG. 2 illustrates an example computing system 200 that includes an active input/output expander (AIOE) 216 associated with a memory sub-system 210, in accordance with some embodiments of the present disclosure. The AIOE 216 is communicatively coupled to a memory sub-system controller 215. The memory sub-system controller 215 can perform the same functions as memory sub-system controller 115 of FIG. 1, and the AIOE 216 can perform the same function as AIOE 116 of FIG. 1. The AIOE 216 is communicatively coupled to multiple memory devices 230A-230N, each having sets of multiple memory die 231A-231N. The AIOE 216 manages signals between the memory sub-system controller 215 and the memory devices 230A-230N to execute various commands received from the host system 220 (e.g., read and write commands). The AIOE 216 includes a controller-side serial interface 260 to communicate with the memory sub-system controller 215 via lanes 218, 219. In embodiments, lanes 218 can include three single signal lanes, and lanes 219 can include 2 pairs of differential I/O lanes. The number of single and differential lanes can be more or fewer, and can be increased or decreased. The AIOE 216 is communicatively coupled with memory devices 230A-230N. In embodiments, the AIOE 216 is communicatively couple with the memory devices 230A-230N through a parallel interface. In some embodiments, the AIOE 216 can include memory-side ONFI interfaces 270A-270N to communicate with the multiple memory devices 230A-230N and corresponding memory die 231A-231N via a respective ONFI channels 280A-280N.

The host system 220 can send an I/O command via controller interface 224 to the memory sub-system controller 215. In embodiments, the memory sub-system controller 215 can be connected to the host system 220 via a serial interface. In embodiments, the memory sub-system controller 215 can be connected to the host system 220 via a parallel interface. The host-side interface 214 of the memory sub-system controller 215 can receive the I/O command from host system 220. The compute module 211 of the memory sub-system controller 215 can determine the type of command received and determine to transmit the command to the memory devices 230A-230N via the AIOE 216.

In embodiments, the compute module 211 can process the I/O command. Processing the I/O command can include identifying the logical address specified by the I/O command, and translating the logical address to a physical block address. In embodiments, the compute module 211 can use a logical-to-physical mapping data structure to identify the physical address of the memory die 231A-231N associated with the logical address included in the I/O command received from the host system 220. In embodiments, processing the I/O command can include converting the I/O command to a serial interface compliant signal. For example, the compute module 211 can include a parallel-to-serial function to convert the I/O command to a serial interface compliant signal. In embodiments, the parallel-to-serial function can load the data received from the parallel signal into the latches of a shift register, and then transmit the data from the latches one bit at a time through a serial interface. The serial AIOE interface 212 can send the processed I/O command to the controller-side serial interface 260 of AIOE 216. The processed I/O command can be sent to the AIOE 216 via a differential lane 219. Responsive to successfully receiving the processed I/O command from the memory sub-system controller 215, the AIOE 216 can send an indication to the memory sub-system controller 215 that the I/O command was successfully received, e.g., via differential lane 219. In embodiments, differential lanes 219 can include pairs of differential signals, one signal in the pair used to transmit signals and one signal in the pair used to receive signals.

The AIOE 216 includes switch module 225 to perform various operations and functions relating to the processing of signals between the memory sub-system controller 215 and the memory devices 230A-230N. Switch module 225 can receive signals from the controller-side serial interface 260 of the AIOE 216. Switch module 225 can determine to which memory device 230A-230N the signal is directed. In some embodiments, switch module 225 can decode the signal to determine the address specified by the received command. The address can be a logical address, in which case the switch module 225 can translate the logical address to a physical block address. In some embodiments, the address can be a physical block address. In some embodiments, the memory sub-system controller 215 can translate the logical address associated with the I/O command to a physical block address. The switch module 225 can identify the physical memory location residing on one of memory devices 230A-230N referenced by the physical block address. The switch module 225 can also generate a parallel interface compliant signal. For example, the switch module 225 can include a serial-to-parallel function to convert the serial signal (i.e., a series of time pulses) to a parallel array of output signals. The switch module 225 can then transmit the parallel interface compliant signal to the appropriate memory-side ONFI interface 270A-270N associated with the corresponding memory device 230A-230N.

In embodiments, the switch module 225 can receive data from the memory devices 230A-230N via the memory-side ONFI interfaces 270A-270N. The switch module 225 can generate a serial interface compliant signal containing the received data to send to the controller-side serial interface 260. In embodiments, the switch module 225 can use a shift register to generate the interface compliant signal by loading the data received from the parallel signal into the latches of the shift register and transmitting the data one bit at a time. The controller-side serial interface 260 can then transmit the signal to the serial AIOE interface 212 of memory sub-system controller 215.

As mentioned, the AIOE 216 is connected to the memory sub-system controller 215 via a serial interface. The serial interface includes multiple lanes connecting the AIOE 216 to the memory sub-system controller 215. In embodiments, the serial interface can include three single signal lanes 218, and two pairs of differential lanes 219 (i.e., four differential lanes 219). The single signal lanes 218 can be used to transmit various signals from the memory sub-system controller 215, via the serial AIOE interface 212, to the AIOE 216, via the controller-side serial interface 260. The single signal lanes 218 can transmit a signal along with a differential signal to provide information directing the receiver how to treat the data being sent via the differential signals. In embodiments, the single signal lanes 218 can be used to transmit a reference clock (e.g., REFCLK in PCIe protocol), a fundamental reset (e.g., PERST in PCIe protocol), and/or a clock request signal (e.g., CLKREQ in PCIe protocol). For example, if the serial AIOE interface 212 sends a PERST command via one of the single signal lanes 218, the AIEO 216 can ignore the data in the accompanying differential signal(s) because the PERST command indicates that the device is being reset. The differential lane pairs 219 can include a transmit signal and a receive signal between the memory sub-system controller 215 and the AIOE 216. The differential lane pairs 219 can be used to transmit data along with the intended destination address for the data being sent. In other embodiments, the serial interface can include additional or fewer single signal lanes 218, and additional or fewer differential lanes 219.

In some embodiments, a local controller of memory devices 230A-230N can send a notification to AIOE 216 via channels 280A-N that the I/O command has been successfully performed (e.g., if the I/O command is a write command, the notification indicates that the data has been successfully written to the corresponding memory die 231A-231N). The switch module 225 can convert the notification from a parallel signal to a serial signal (i.e., a series of pulses). In embodiments, the switch module 225 can covert the notification by loading the data received from the parallel signal into latches of a shift register, and then transmitting the data one bit at a time. The switch module 225 can send, through the controller-side serial interface 260, the serial signal notification (e.g., one bit at a time) to the memory sub-system controller 215. The serial signal notification can be sent through a differential signal 219. The memory sub-system controller 215 can receive, via the serial AIOE interface 212, the notification that the I/O command has been successfully performed. The memory sub-system controller 215 can then send, via host-side interface 214, a notification to the host system 220 (e.g., to controller interface 224) that the I/O command has been successfully performed. In embodiments, the memory sub-system controller 215 is communicatively coupled to the host system 220 using a serial interface, in which the signal does not need to be converted. In some embodiments, the memory sub-system controller 215 is communicatively coupled to the host system 220 using a parallel interface, in which case the compute module 211 can convert the serial signal to a parallel signal prior to sending the notification to the host system 220 indicating that the I/O command has been successfully performed. For example, the compute module 211 can use a serial-to-parallel function to convert the serial signal to a parallel signal. The serial-to-parallel function can use flip flops (or latches) in a shift register to execute a sample and hold circuit that receives a serial signal, stores the received data, and then generates a parallel signal using the stored data.

Figure 3:
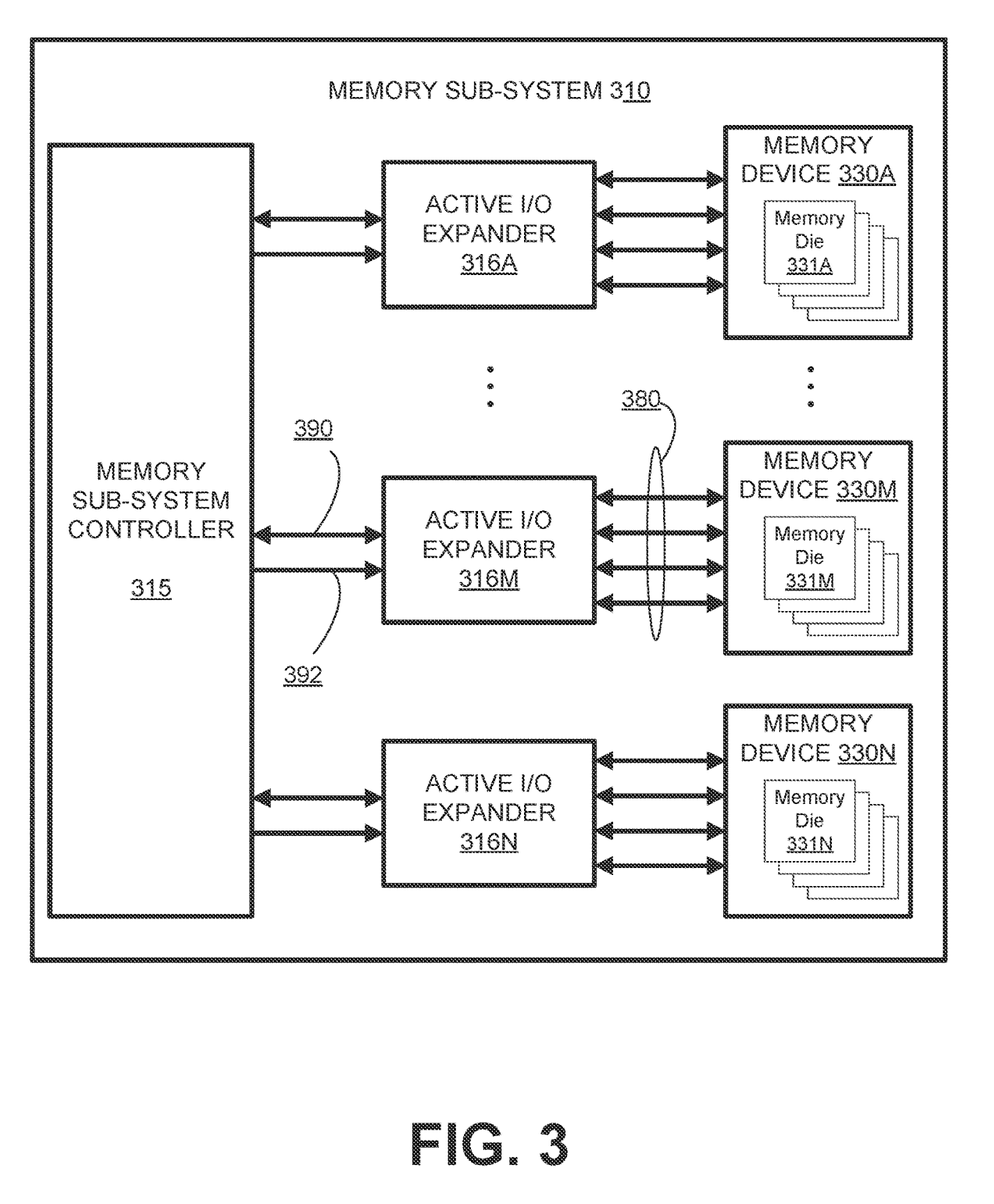
FIG. 3 illustrates an example memory sub-system that includes multiple active input/output expanders, in accordance with some embodiments of the present disclosure.

FIG. 3 illustrates an example memory sub-system 310 that includes multiple active input/output expanders 316A-316N, in accordance with some embodiments of the present disclosure. Memory sub-system 310 can include a memory sub-system controller 315, that can perform the same functions as memory sub-system controller 115 of FIG. 1 and memory sub-system controller 215 of FIG. 2. Memory sub-system controller 315 can be communicatively coupled to multiple active input/output expanders AIOE 316A-316N. In embodiments, AIOE 316A-316N can perform the same functions as AIOE 116 of FIG. 1 and AIOE 216 of FIG. 2. Each AIOE 316A-316N can be communicatively coupled to a memory device 330A-330N.

In embodiments, AIOE 316A-316N can be communicatively coupled to memory sub-system controller 315 via one or more conductive lines. For example, AIOE 316M can be communicatively coupled to memory sub-system controller 315 via signal lines 390, 392. In embodiments, lines 390 can include one or more differential lines used to transmit data between the memory sub-system controller 315 and the AIOE 316M. Lines 392 can include one or more single lines used to transmit data from the memory sub-system controller 315 to the AIOE 316M. Conductive lines 390, 392 can be serial lanes, and hence transmit bits of data sequentially. Similar conductive lines can be used to transmit data between the memory sub-system controller 315 and the other AIOE 316A-316M.

In embodiments, AIOE 316A-316N can be communicatively coupled to memory device 330A-330N via one or more channels. A channel can refer to a communications line between the AIOE 316A-316N and the memory devices 330A-330N. A channel can include multiple conductive wires for transmitted bits of data simultaneously. For example, AIOE 316M can be communicatively coupled to memory device 330M via four channels 380, one channel for each memory die 331M in memory device 330M. As an example, one of the channels 380 can include 8 wires to convey 8 bits of data simultaneously between the AIOE 316M and one memory die 331M of memory device 330M. In embodiments, there can be more or fewer channels 380, and more or fewer memory die 331M. The AIOE 316M can be coupled to memory device 330M using a parallel interface. In embodiments, the channels 380 can be ONFI channels. Similar channels can be used to transmit data between the AIOE 316A-316N and their respective memory device 330A-330N.

Figure 4:
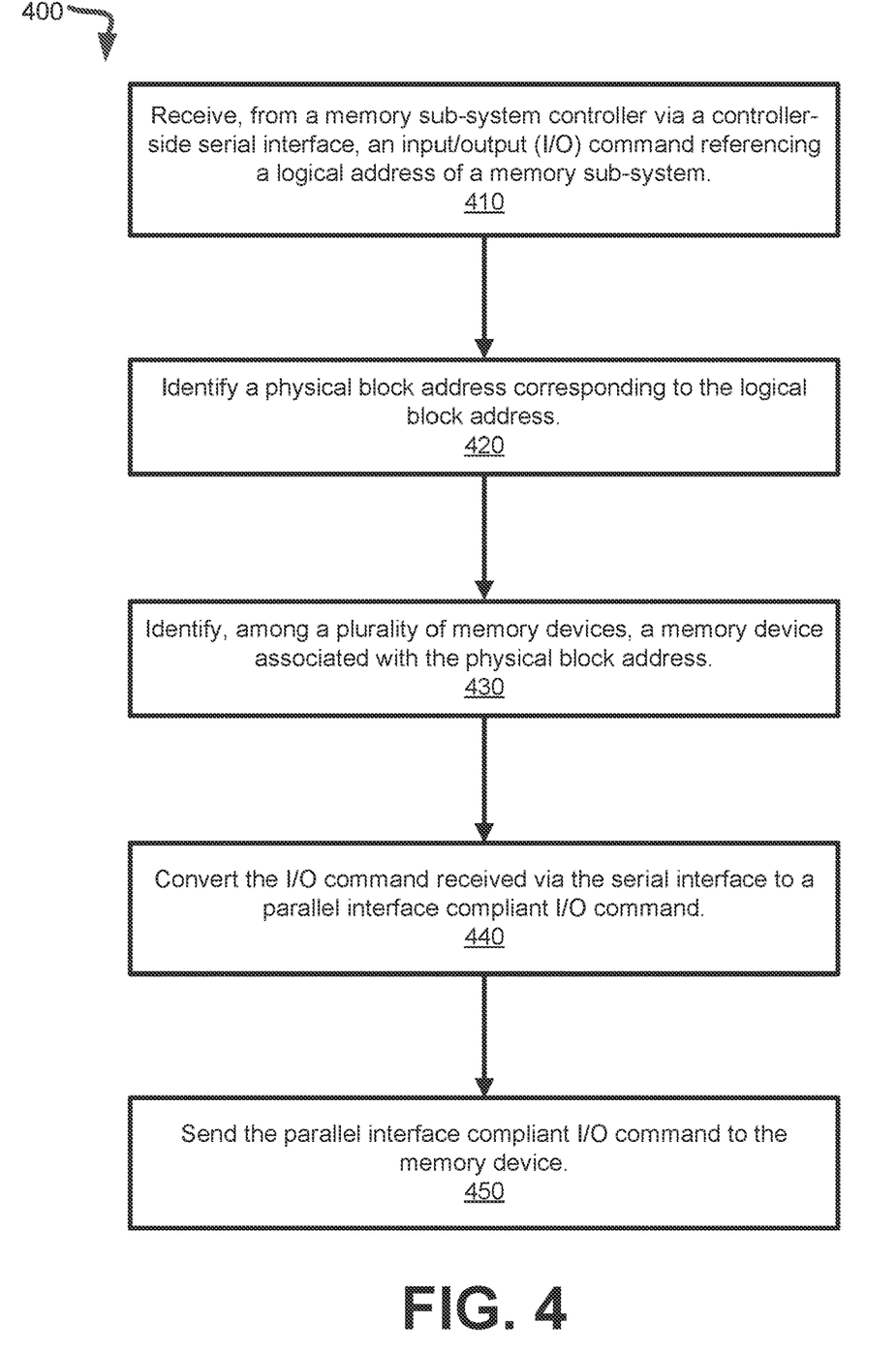
FIG. 4 is a flow diagram of an example method of an active input/output expander processing an input/output command from a host system in accordance with some embodiments of the present disclosure.

FIG. 4 is a flow diagram of an example method 400 of an active input/output expander processing an input/output command from a host system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the AIOE component 113 and/or the AIOE 116 of FIG. 1. In some embodiments, the method 400 is performed by the AIOE 216 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives, from a memory sub-system controller via a controller-side serial interface, an input/output (I/O) command referencing a logical address. The I/O command is received via a differential signal. A differential signal can include a pair of differential signal lanes, one differential signal lane in the pair used to transmit a signal and the other differential signal lane in the pair used to receive signal. In embodiments, responsive to successfully receiving the I/O command from the memory sub-system controller, the processing logic can send to the memory sub-system controller an indication that the I/O command has been successfully received. The indication can be notification send to the memory sub-system controller.

At operation 420, the processing logic identifies a physical block address corresponding to the logical block address. The processing logic can use a logical-to-physical data structure to identify the physical address of the memory units associated with the logical address included in the I/O command received from the host system.

At operation 430, the processing logic identifies, among a plurality of memory devices operatively coupled to the memory sub-system controller, a memory device associated with the physical block address. In embodiments, the processing logic can use a mapping table stored on in the memory sub-system to identify the memory device associated with the physical block address.

At operation 440, the processing logic converts the I/O command received via the serial interface to a parallel interface compliant I/O command. In embodiments, the processing logic includes a serial-to-parallel device that can convert a serial signal (i.e., a series of time pulses) to a parallel array of output pins.

At operation 450, the processing logic sends the parallel interface compliant I/O command to the memory device. The processing logic can further receive, via a memory-side parallel interface of the AIOE, data from the memory device in response to the I/O command. For example, the I/O command can be a read command, in which case the memory device can send read data to the AIOE. The processing logic can further send, via the controller-side interface of the AIOE, the data to the host system. Since the memory-side interface is a parallel interface, and the controller-side interface is a serial interface, the processing logic can convert the signal received from the memory device containing the data from a parallel interface compliant signal to a serial interface compliant signal.

In embodiments, the processing logic can receive, from a controller of the memory device, a notification indicating that the I/O command has been successfully performed. For example, if the I/O command is a write command, the controller of the memory device can send a notification to the processing logic to indicate that the data has been successfully written at the physical address. Responsive to receiving a notification that the I/O command has been successfully performed, the processing logic can send, to the memory sub-system controller, an indication that the I/O command has been successfully performed.

In embodiments, the processing logic can receive, from the memory sub-system controller, at least one of a reference clock command, a fundamental reset, or a clock request signal. These signals can be received via a single signal lane on the host-side interface of the AIOE.

Figure 5:
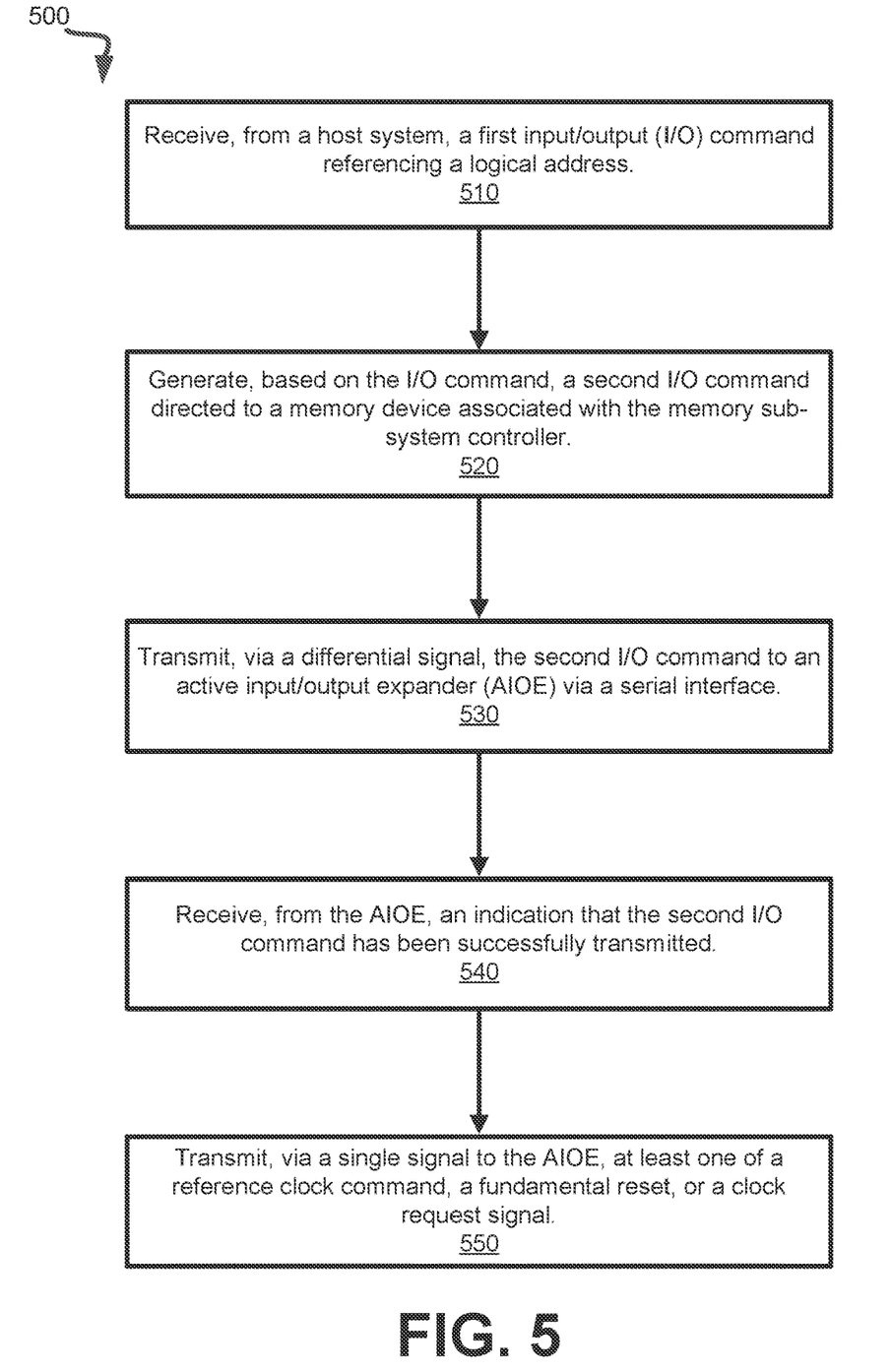
FIG. 5 is a flow diagram of an example method of a memory sub-system communicatively coupled with an active input/output expander with a serial interface processing an input/output command, in accordance with some embodiments of the present disclosure.

FIG. 5 is a flow diagram of an example method 500 of a memory sub-system communicatively coupled with an active input/output expander with a serial interface processing an input/output command, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the active I/O expander component 113 of FIG. 1. In some embodiments, the method 500 is performed by the memory sub-system controller 215 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives, from a host system, a first input/output command referencing a logical address. The first I/O command can be a read command, a write command, a read status command, a get feature command, or some other I/O command.

At operation 520, the processing logic generates, based on the first I/O command, a second I/O command directed to a memory device associated with the memory sub-system controller. In embodiments, the processing logic identifies a physical block address corresponding to the logical address. In some embodiments, the processing logic can use a logical-to-physical data structure to translate the logical address to a physical block address. The processing logic can identify the memory device associated with the physical block address. In some embodiments, the signal to transmit the first I/O command from the host system is received via a parallel interface. In such a case, the processing logic converts the signal to a serial signal.

At operation 530, the processing logic transmits, via a transmit signal of a differential signal, the second I/O command to an active input/output expander (AIOE) via a serial interface. In some embodiments, the processing logic selects the AIOE from a plurality of AIOE in view of the first I/O command. For example, the memory sub-system can contain multiple AIOE, one for each memory device. In such an example, the processing logic can identify the AIOE coupled to the memory device of the physical block address.

At operation 540, the processing logic receives, from the AIOE, an indication that the second I/O command has been successfully transmitted. In embodiments, the processing logic can also receive an indication that the first I/O command has been successfully performed. For example, responsive to determining that the first I/O command is a write command, the processing logic can receive a notification from the AIOE that the write command has been successfully performed. The processing logic can send an indication to the host system, notifying the host system that the write command has been successfully performed.

In another example, the first I/O command can be a read command. Responsive to determining that the first I/O command is a read command, the processing logic can receive read data from the AIOE. The read data can be received via the receive signal of the differential signal. The processing logic can transmit the read data to the host system. In some embodiments, the processing logic can convert the serial signal before sending it to the host system.

At operation 550, the processing logic transmits, via a single signal to the AIOE, at least one of a reference clock command, a fundamental reset, or a clock request signal.

Figure 6:
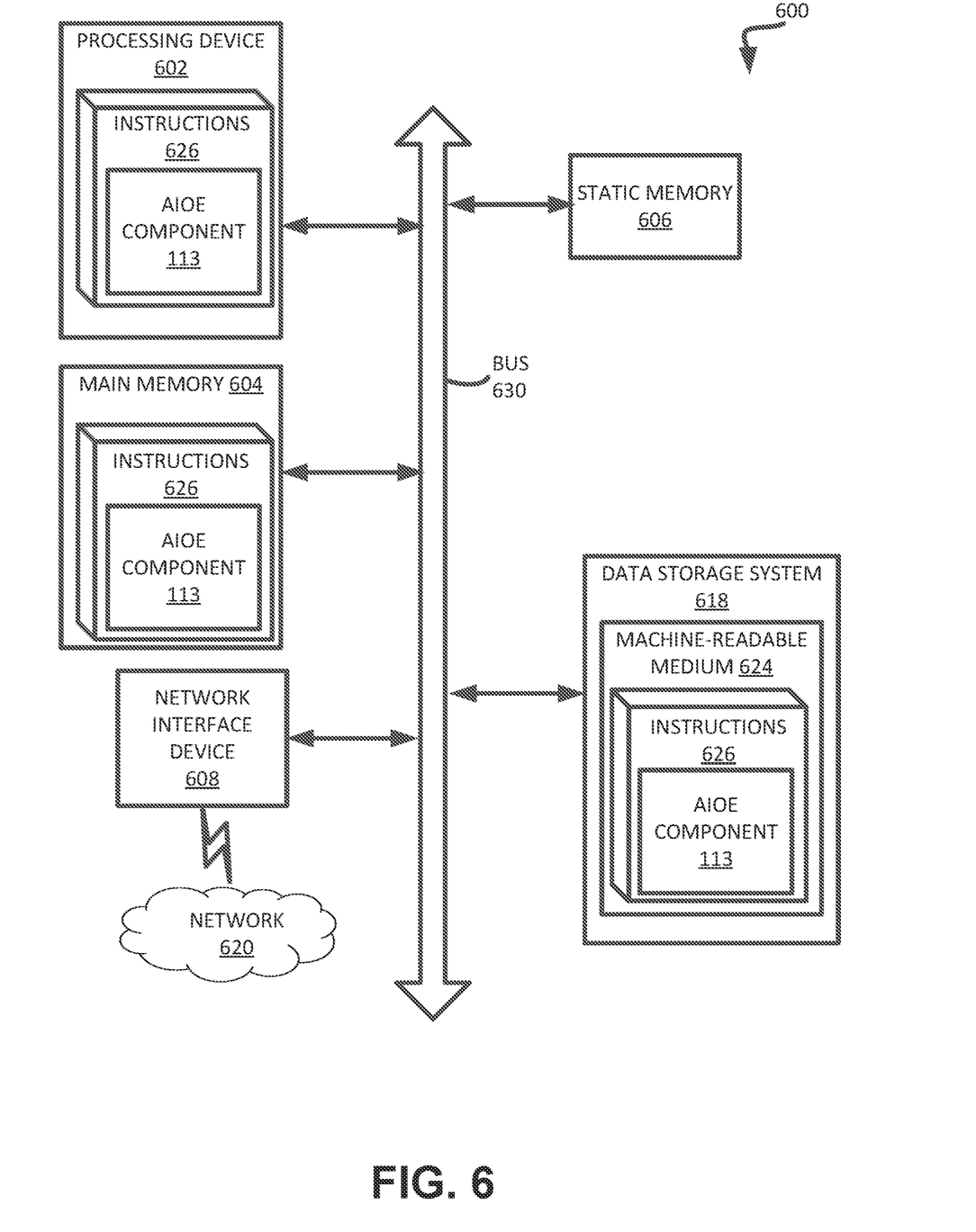
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the active input/output expander (AIOE) component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a AIOE component (e.g., the AIOE component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system comprising:
    a plurality of memory devices; and
    a memory sub-system controller operatively coupled to the plurality of memory devices via an active input/output expander (AIOE), wherein the AIOE is coupled to the memory sub-system controller via a serial interface comprising a plurality of single signal lanes, and wherein the AIOE is coupled to the memory devices via a parallel interface, the AIOE to perform operations comprising:
        receiving, from the memory sub-system controller via the plurality of single signal lanes of the serial interface of the AIOE, at least one of: a reference clock command, a fundamental reset, and a clock request signal;
        receiving, from the memory sub-system controller via the serial interface of the AIOE, an input/output (I/O) command referencing a logical address;
        identifying a physical block address corresponding to the logical address;
        identifying, among the plurality of memory devices, a memory device associated with the physical block address;
        converting the I/O command received via the serial interface to a parallel interface-compliant I/O command;
        responsive to converting the I/O command received via the serial interface to the parallel interface-compliant I/O command, sending, to the identified memory device of the plurality of memory devices, via the parallel interface, the parallel interface-compliant I/O command; and
        receiving, via the parallel interface, a notification from the identified memory device indicating that the I/O command has been successfully performed.

2. The memory sub-system of claim 1, further comprising:
    receiving, via the parallel interface of the AIOE, data from the identified memory device; and
    sending, via the serial interface of the AIOE, the data to a host system.

3. The memory sub-system of claim 2, further comprising:
    converting the data from a parallel interface-compliant signal to a serial interface- compliant signal prior to sending the data to the host system.

4. The memory sub-system of claim 1, wherein the I/O command is received via a differential signal.

5. The memory sub-system of claim 1, further comprising:
    responsive to receiving, from the memory sub-system controller, the I/O command, sending, to the memory sub-system controller, an indication that the I/O command has been successfully received.

6. The memory sub-system of claim 1, further comprising:
    responsive to receiving the notification from a controller of the identified memory device indicating that the I/O command has been successfully performed, sending, via the serial interface, an indication to the memory sub-system controller that the I/O command has been successful performed.

7. A method comprising:
    receiving, by a memory sub-system controller from a host system, a first input/output (I/O) command referencing a logical address, wherein the memory sub-system controller is coupled to an active input/output expander (AIOE) via a serial interface comprising a plurality of single signal lanes;
    generating, based on the first I/O command, a second I/O command directed to a memory device associated with the memory sub-system controller;
    transmitting, via a differential signal, the second I/O command to the AIOE via the serial interface;

transmitting, to the AIOE via the plurality of single signal lanes of the serial interface, at least one of: a reference clock command, a fundamental reset, and a clock request signal; and receiving, from the AIOE, an indication that the second I/O command has been successfully performed.

8. The method of claim 7, wherein generating, in view of the first I/O command, the second I/O command directed to the memory device comprises:
identifying a physical block address corresponding to the logical address; and
identifying the memory device associated with the physical block address.

9. The method of claim 7, further comprising selecting the AIOE from a plurality of AIOE in view of the first I/O command.

10. The method of claim 7, further comprising:
responsive to determining that the first I/O command is a read command, receiving, via the differential signal, read data from the AIOE; and
transmitting the read data to the host system.

11. The method of claim 7, further comprising:
responsive to determining that the first I/O command is a write command, receiving a notification from the AIOE that the write command has been successfully performed; and
transmitting a second indication to the host system that the write command has been successfully performed.

12. A non-transitory computer-readable storage medium comprising instructions that, when executed by a processing device, cause the processing device to perform operations comprising:
receiving, from a memory sub-system controller via an active input/output expander (AIOE), an input/output (I/O) command referencing a logical address, wherein the AIOE is coupled to the memory sub-system controller via a serial interface comprising a plurality of single signal lanes, and wherein the AIOE is coupled to a plurality of memory devices via a parallel interface;
receiving, from the memory sub-system controller via the plurality of single signal lanes of the serial interface of the AIOE, at least one of: a reference clock command, a fundamental reset, and a clock request signal;
identifying a physical block address corresponding to the logical address;
identifying, among the plurality of memory devices, a memory device associated with the physical block address;
converting the I/O command received via the serial interface to a parallel interface-compliant I/O command;
responsive to converting the I/O command received via the serial interface to the parallel interface-compliant I/O command, sending, to the identified memory device of the plurality of memory devices, via the parallel interface, the parallel interface-compliant I/O command; and
receiving, via the parallel interface, a notification from the identified memory device indicating that the I/O command has been successfully performed.

13. The non-transitory computer-readable storage medium of claim 12, wherein the processing device is to perform operations further comprising:
receiving, via the parallel interface of the AIOE, data from the identified memory device; and
sending, via the serial interface of the AIOE, the data to a host system.

14. The non-transitory computer-readable storage medium of claim 13, wherein the processing device is to perform operations further comprising:
converting the data from a parallel interface-compliant signal to a serial interface- compliant signal prior to sending the data to the host system.

15. The non-transitory computer-readable storage medium of claim 12, wherein the I/O command is received via a differential signal.

16. The non-transitory computer-readable storage medium of claim 12, wherein the processing device is to perform operations further comprising:
responsive to receiving, from the memory sub-system controller, the I/O command, sending, to the memory sub-system controller, an indication that the I/O command has been successfully received.

17. The non-transitory computer-readable storage medium of claim 12, wherein the processing device is to perform operations further comprising:
responsive to receiving the notification from a controller of the identified memory device indicating that the I/O command has been successfully performed, sending, via the serial interface, an indication to the memory sub-system controller that the I/O command has been successful performed.

* * * * *